United States Patent
Fujikata

(10) Patent No.: US 11,910,719 B2
(45) Date of Patent: Feb. 20, 2024

(54) PIEZOELECTRIC FILM

(71) Applicant: FUJIFILM Corporation, Tokyo (JP)

(72) Inventor: Shingo Fujikata, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 297 days.

(21) Appl. No.: 17/553,804

(22) Filed: Dec. 17, 2021

(65) Prior Publication Data

US 2022/0109098 A1  Apr. 7, 2022

Related U.S. Application Data

(63) Continuation of application No. PCT/JP2020/020646, filed on May 26, 2020.

(30) Foreign Application Priority Data

Jun. 28, 2019 (JP) .................................. 2019-121704

(51) Int. Cl.
    *H04R 25/00* (2006.01)
    *H10N 30/85* (2023.01)
    *H04R 17/00* (2006.01)

(52) U.S. Cl.
    CPC ........... *H10N 30/852* (2023.02); *H04R 17/00* (2013.01)

(58) Field of Classification Search
    CPC .............. H01L 41/0472; H01L 41/0533; H01L 41/083; H10L 30/877; H10L 30/85; H10L 30/072; H04R 7/04; H04R 17/005
    See application file for complete search history.

(56) References Cited

U.S. PATENT DOCUMENTS

| 9,621,997 B2 | 4/2017 | Miyoshi et al. |
| 2005/0236710 A1 | 10/2005 | Akiyama et al. |
| 2018/0069172 A1 | 3/2018 | Fukunaga et al. |

(Continued)

FOREIGN PATENT DOCUMENTS

| JP | 2004006535 | 1/2004 |
| WO | 2014162976 | 10/2014 |

(Continued)

OTHER PUBLICATIONS

"International Search Report (Form PCT/ISA/210) of PCT/JP2020/020646," dated Jul. 28, 2020, with English translation thereof, pp. 1-5.

(Continued)

*Primary Examiner* — Amir H Etesam
(74) *Attorney, Agent, or Firm* — JCIPRNET

(57) ABSTRACT

Provided is a piezoelectric film capable of realizing a piezoelectric speaker in which a high sound pressure is obtained, a sufficient sound pressure characteristic is obtained in a wide frequency band, and generation of a chattering sound particularly in a low sound can be suppressed. The piezoelectric film is a piezoelectric film including a polymer-based piezoelectric composite material which contains piezoelectric particles in a matrix containing a polymer material, and electrode layers which are laminated on both surfaces of the polymer-based piezoelectric composite material, in which a variation coefficient of a destructive force of a laminate having the polymer-based piezoelectric composite material and the electrode layers in a plane direction is 0.25 or less.

20 Claims, 4 Drawing Sheets

(56) References Cited

U.S. PATENT DOCUMENTS

2018/0160248 A1 6/2018 Murakami et al.
2021/0392453 A1 12/2021 Murakami et al.

FOREIGN PATENT DOCUMENTS

| WO | WO2017010135 | * | 4/2016 |
| WO | 2017010135 | | 1/2017 |
| WO | 2017018313 | | 2/2017 |

OTHER PUBLICATIONS

"Written Opinion of the International Searching Authority (Form PCT/ISA/237)" of PCT/JP2020/020646, dated Jul. 28, 2020, with English translation thereof, pp. 1-6.
"Office Action of Taiwan Counterpart Application", dated Jul. 19, 2023, with partial English translation thereof, p. 1-p. 9.

* cited by examiner

PIEZOELECTRIC FILM

CROSS-REFERENCE TO RELATED APPLICATIONS

This application is a Continuation of PCT International Application No. PCT/JP2020/020646 filed on May 26, 2020, which claims priority under 35 U.S.C. § 119(a) to Japanese Patent Application No. 2019-121704 filed on Jun. 28, 2019. The above application is hereby expressly incorporated by reference, in its entirety, into the present application.

BACKGROUND OF THE INVENTION

1. Field of the Invention

The present invention relates to a piezoelectric film used for an electroacoustic conversion film or the like.

2. Description of the Related Art

With reduction in thickness and weight of displays such as liquid crystal displays or organic electroluminescence (EL) displays, speakers used in these thin displays are also required to be lighter and thinner. Further, with the development of flexible displays formed of flexible substrates such as plastics, speakers used in the flexible displays are also required to be flexible.

Examples of typical shapes of speakers of the related art include a funnel-like so-called cone shape and a spherical dome shape. However, in a case where such a speaker is intended to be incorporated in the above-described thin display, there is a concern that the lightness and the flexibility of the speaker are impaired because the speaker cannot be sufficiently made thin. Further, in a case where the speaker is attached externally, it is troublesome to carry the speaker.

Therefore, as a speaker that is thin and can be integrated into a thin display or a flexible display without impairing lightness and flexibility, a sheet-like piezoelectric film having flexibility and a property of stretching and contracting in response to an applied voltage has been suggested.

For example, the applicant suggested a piezoelectric film (electroacoustic conversion film) disclosed in WO2017/018313A as a sheet-like piezoelectric film that has flexibility and can stably reproduce a high-quality sound.

For example, the piezoelectric film disclosed in WO2017/018313A includes a polymer-based piezoelectric composite material (piezoelectric layer) obtained by dispersing piezoelectric particles in a viscoelastic matrix consisting of a polymer material having a viscoelasticity at room temperature, a thin film electrode formed on each of both surfaces of the polymer-based piezoelectric composite material, and a protective layer formed on a surface of the thin film electrode. Further, in the piezoelectric film disclosed in WO2017/018313A, an intensity ratio $\alpha 1$ of a (002) plane peak intensity and a (200) plane peak intensity derived from the piezoelectric particles ((002) plane peak intensity/((002) plane peak intensity+(200) plane peak intensity)) in a case where the polymer-based piezoelectric composite material is evaluated by an X-ray diffraction method is 0.6 or greater and less than 1.

SUMMARY OF THE INVENTION

In a case where such a piezoelectric film is used as, for example, a piezoelectric speaker (electroacoustic conversion film), various characteristics are required.

As an example, a piezoelectric speaker is required to have various characteristics such as a characteristic of obtaining a sufficient sound pressure (volume) with respect to an input operating voltage, a characteristic of obtaining a sufficient sound pressure in a wide frequency band, and a characteristic in which a so-called chattering sound is not generated particularly in a low frequency region.

However, the requirement for the characteristics of the piezoelectric speaker has been stricter in recent years, and the appearance of a piezoelectric film capable of realizing a piezoelectric speaker that more suitably satisfies the above-described requirement is desired.

The present invention has been made to solve such problems of the related art, and an object thereof is to provide a piezoelectric film capable of realizing a piezoelectric speaker in which a sufficient sound pressure with respect to an input operating voltage is obtained, a sufficient sound pressure characteristic is obtained in a wide frequency band, and generation of a so-called chattering sound particularly in a low frequency region can be suppressed, for example, in a case where the piezoelectric film is used for a piezoelectric speaker as an electroacoustic conversion film.

In order to solve the above-described problem, the present invention has the following configurations.

[1] A piezoelectric film comprising: a polymer-based piezoelectric composite material which contains piezoelectric particles in a matrix containing a polymer material; and electrode layers which are laminated on both surfaces of the polymer-based piezoelectric composite material, in which a variation coefficient of a destructive force of a laminate having the polymer-based piezoelectric composite material and the electrode layers in a plane direction is 0.25 or less.

[2] The piezoelectric film according to [1], in which an average value of the destructive force of the laminate is 3 N or greater.

[3] The piezoelectric film according to [1] or [2], further comprising: a protective layer laminated on a surface of at least one electrode layer.

[4] The piezoelectric film according to [3], in which a protective layer is laminated on both surfaces of the electrode layers.

[5] The piezoelectric film according to any one of [1] to [4], in which the polymer material contains a cyanoethyl group.

[6] The piezoelectric film according to [5], in which the polymer material is cyanoethylated polyvinyl alcohol.

[7] The piezoelectric film according to any one of [1] to [6], in which the piezoelectric particles consist of ceramic particles having a perovskite-type or wurtzite-type crystal structure.

According to the present invention, it is possible to provide a piezoelectric film capable of realizing a piezoelectric speaker in which a sufficient sound pressure (volume) with respect to an input operating voltage is obtained, a sufficient sound pressure characteristic is obtained in a wide frequency band, and generation of a so-called chattering sound particularly in a low frequency region can be suppressed, for example, in a case where the piezoelectric film is used for a piezoelectric speaker as an electroacoustic conversion film.

DESCRIPTION OF THE PREFERRED EMBODIMENTS

Figure 1:
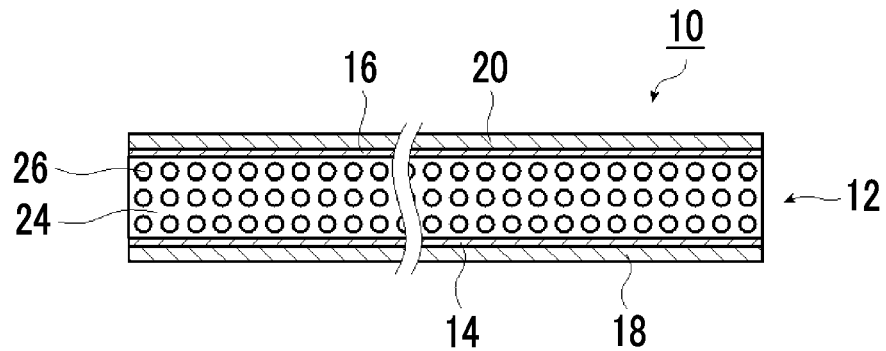
FIG. 1 is a cross-sectional view conceptually illustrating an example of the piezoelectric film according to the embodiment of the present invention.

Hereinafter, the piezoelectric film of the present invention will be described in detail based on the preferred embodiments shown in the accompanying drawings.

Descriptions of the constituent requirements described below may be made based on representative embodiments of the present invention, but the present invention is not limited to such embodiments.

In the present specification, a numerical range shown using "to" indicates a range including numerical values described before and after "to" as a lower limit and an upper limit.

A piezoelectric film according to the embodiment of the present invention includes electrode layers on both surfaces of the polymer-based piezoelectric composite material. The polymer-based piezoelectric composite material is a material containing piezoelectric particles in a matrix containing a polymer material. Further, as a preferred embodiment, the piezoelectric film according to the embodiment of the present invention further includes protective layers laminated on the electrode layers.

In such a piezoelectric film according to the embodiment of the present invention, the variation coefficient of the destructive force of a laminate having the polymer-based piezoelectric composite material and the electrode layers in a plane direction is 0.25 or less.

The piezoelectric film according to the embodiment of the present invention is used, for example, as an electroacoustic conversion film. Specifically, the piezoelectric film according to the embodiment of the present invention is used as a vibration plate of an electroacoustic converter such as a piezoelectric speaker, a microphone, or a voice sensor.

In an electroacoustic converter, in a case where the piezoelectric film is stretched in the in-plane direction due to application of a voltage to the piezoelectric film, the piezoelectric film moves upward (in the radiation direction of the sound) in order to absorb the stretched part. On the contrary, in a case where the piezoelectric film is contracted in the in-plane direction due to application of a voltage to the piezoelectric film, the piezoelectric film moves downward in order to absorb the contracted part.

The electroacoustic converter converts vibration (sound) and an electric signal using vibration caused by repeated stretch and contraction of the piezoelectric film. Such an electroacoustic converter is used to input an electric signal to the piezoelectric film to reproduce a sound due to the vibration in response to the electric signal and used to convert the vibration of the piezoelectric film to an electric signal by receiving a sound wave. Further, the piezoelectric film can be used to apply tactile sensation or transport an object through the vibration.

Specifically, the applications of piezoelectric film include speakers such as full-range speakers, tweeters, squawkers, and woofers, speakers for headphones, noise cancellers, microphones, and pickups (sensors for musical instruments) used for musical instruments such as guitars. Further, the piezoelectric film according to the embodiment of the present invention is a non-magnetic material, and thus can be suitably used as a noise canceller for MRI among noise cancellers.

Further, the electroacoustic converter formed of the piezoelectric film according to the embodiment of the present invention is thin, light, and bendable, and thus can be suitably used as wearable products such as hats, mufflers, and clothes, thin displays such as televisions and digital signage, buildings having a function as an acoustic device, ceilings of automobiles, curtains, umbrellas, wallpaper, windows, beds, and the like.

FIG. 1 is a cross-sectional view conceptually illustrating an example of the piezoelectric film according to the embodiment of the present invention.

A piezoelectric film 10 illustrated in FIG. 1 includes a piezoelectric layer 12, a lower thin film electrode 14 laminated on one surface of the piezoelectric layer 12, a lower protective layer 18 laminated on the lower thin film electrode 14, an upper thin film electrode 16 laminated on the other surface of the piezoelectric layer 12, and an upper protective layer 20 laminated on the upper thin film electrode 16.

In the piezoelectric film 10, the piezoelectric layer 12 contains piezoelectric particles 26 in a polymer matrix 24 containing a polymer material, as conceptually illustrated in FIG. 1. That is, the piezoelectric layer 12 is a polymer-based piezoelectric composite material in the piezoelectric film according to the embodiment of the present invention.

Here, it is preferable that the polymer-based piezoelectric composite material (piezoelectric layer 12) satisfies the following requirements. Further, in the present invention, room temperature is in a range of 0° C. to 50° C.

(i) Flexibility

For example, in a case of being gripped in a state of being loosely bent like a document such as a newspaper or a magazine as a portable device, the piezoelectric film is continuously subjected to large bending deformation from the outside at a relatively slow vibration of less than or equal to a few Hz. In this case, in a case where the polymer-based piezoelectric composite material is hard, a large bending stress is generated to that extent, and a crack is generated at the interface between a polymer matrix and piezoelectric particles, which may lead to breakage. Accordingly, the polymer-based piezoelectric composite material is required to have suitable flexibility. In addition, in a case where strain energy is diffused into the outside as heat, the stress is able to be relieved. Therefore, the polymer-based piezoelectric composite material is required to have a suitably large loss tangent.

(ii) Acoustic Quality

In a speaker, the piezoelectric particles vibrate at a frequency of an audio band of 20 Hz to 20 kHz, and the vibration energy causes the entire vibration plate (polymer-based piezoelectric composite material) to vibrate integrally so that a sound is reproduced. Therefore, in order to increase the transmission efficiency of the vibration energy, the polymer-based piezoelectric composite material is required to have appropriate hardness. In addition, in a case where the frequencies of the speaker are smooth as the frequency characteristic thereof, an amount of change in acoustic quality in a case where the lowest resonance frequency $f_0$ is changed in association with a change in the curvature of the speaker decreases. Therefore, the loss tangent of the polymer-based piezoelectric composite material is required to be suitably large.

It is known that the lowest resonance frequency $f_0$ of the vibration plate for a speaker is represented by the following equation. Here, s represents the stiffness of the vibration system and m represents the mass.

$$\text{Lowest resonance frequency: } f_0 = \frac{1}{2\pi}\sqrt{\frac{s}{m}}$$

Here, as the degree of curvature of the piezoelectric film, that is, the radius of curvature of the curved portion increases, the mechanical stiffness s decreases, and thus the lowest resonance frequency $f_0$ decreases. That is, the acoustic quality (the volume and the frequency characteristics) of the speaker changes depending on the radius of curvature of the piezoelectric film.

That is, the polymer-based piezoelectric composite material is required to exhibit a behavior of being rigid with respect to a vibration of 20 Hz to 20 kHz and being flexible with respect to a vibration of less than or equal to a few Hz. In addition, the loss tangent of a polymer-based piezoelectric composite material is required to be suitably large with respect to the vibration of all frequencies of 20 kHz or less.

In general, a polymer solid has a viscoelasticity relieving mechanism, and a molecular movement having a large scale is observed as a decrease (relief) in a storage elastic modulus (Young's modulus) or a maximal value (absorption) in a loss elastic modulus along with an increase in temperature or a decrease in frequency. Among these, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

As a matrix of the polymer-based piezoelectric composite material (piezoelectric layer 12), the polymer-based piezoelectric composite material exhibiting a behavior of being rigid with respect to a vibration of 20 Hz to 20 kHz and being flexible with respect to a vibration of less than or equal to a few Hz is realized by using a polymer material whose glass transition point is room temperature, that is, a polymer material having a viscoelasticity at room temperature. In particular, from the viewpoint that such a behavior is suitably exhibited, it is preferable that the polymer material in which the glass transition temperature at a frequency of 1 Hz is at room temperature is used for a matrix of the polymer-based piezoelectric composite material.

In the polymer material, it is preferable that the maximal value of a loss tangent Tan δ at a frequency of 1 Hz according to a dynamic viscoelasticity test at room temperature is 0.5 or greater.

In this manner, in a case where the polymer-based piezoelectric composite material is slowly bent due to an external force, stress concentration on the interface between the polymer matrix and the piezoelectric particles at the maximum bending moment portion is relieved, and thus satisfactory flexibility can be expected.

In the polymer material, it is preferable that a storage elastic modulus (E') at a frequency of 1 Hz according to the dynamic viscoelasticity measurement is 100 MPa or greater at 0° C. and 10 MPa or less at 50° C.

In this manner, the bending moment generated in a case where the polymer-based piezoelectric composite material is slowly bent due to the external force can be reduced, and the polymer-based piezoelectric composite material can exhibit a behavior of being rigid with respect to an acoustic vibration of 20 Hz to 20 kHz.

In addition, it is more suitable that the relative dielectric constant of the polymer material is 10 or greater at 25° C. Accordingly, in a case where a voltage is applied to the polymer-based piezoelectric composite material, a higher electric field is applied to the piezoelectric particles in the polymer matrix, and thus a large deformation amount can be expected.

However, in consideration of ensuring satisfactory moisture resistance and the like, it is suitable that the relative dielectric constant of the polymer material is 10 or less at 25° C.

Suitable examples of the polymer material that satisfies such conditions include cyanoethylated polyvinyl alcohol (cyanoethylated PVA), polyvinyl acetate, polyvinylidene chloride-co-acrylonitrile, a polystyrene-vinyl polyisoprene block copolymer, polyvinyl methyl ketone, and polybutyl methacrylate.

In addition, as these polymer materials, a commercially available product such as Hybrar 5127 (manufactured by Kuraray Co., Ltd.) can be suitably used.

Among these, it is preferable to use a polymer material containing a cyanoethyl group and particularly preferable to use cyanoethylated PVA as the polymer material constituting the polymer matrix 24. That is, in the piezoelectric film 10 according to the embodiment of the present invention, it is preferable to use a polymer material containing a cyanoethyl group and particularly preferable to use cyanoethylated PVA as the polymer matrix 24 of the piezoelectric layer 12.

In the description below, the above-described polymer materials typified by cyanoethylated PVA will also be collectively referred to as the "polymer material having a viscoelasticity at room temperature".

Further, the polymer material having a viscoelasticity at room temperature may be used alone or in combination (mixture) of two or more kinds thereof.

In the piezoelectric film 10 according to the embodiment of the present invention, a plurality of polymer materials may be used in combination as necessary for the polymer matrix 24 of the piezoelectric layer 12.

That is, for the purpose of adjusting dielectric characteristics, mechanical characteristics, and the like, other dielectric polymer materials may be added to the polymer matrix 24 constituting the polymer-based piezoelectric composite material in addition to the polymer material having a viscoelasticity at room temperature as necessary.

Examples of the dielectric polymer material that can be added thereto include a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, or a polyvinylidene fluoride-tetrafluoroethylene copolymer, a polymer containing a cyano group or a cyanoethyl group such as a vinylidene cyanide-vinyl acetate copolymer, cyanoethyl cellulose, cyanoethyl hydroxysaccharose, cyanoethyl hydroxycellulose, cyanoethyl hydroxypullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethyl pullulan, cyanoethyl polyhydroxymethylene, cyanoethyl glycidol pullulan, cyanoethyl saccharose, or cyanoethyl sorbitol, and synthetic rubber such as nitrile rubber or chloroprene rubber.

Among these, a polymer material containing a cyanoethyl group is suitably used.

Further, in the polymer matrix 24 of the piezoelectric layer 12, the number of these dielectric polymer materials is not limited to one, and a plurality of kinds of dielectric polymer materials may be added.

In addition, for the purpose of adjusting the glass transition point Tg of the polymer matrix 24, the polymer matrix 24 may contain a thermoplastic resin such as a vinyl chloride resin, polyethylene, polystyrene, a methacrylic resin, polybutene, or isobutylene, and a thermosetting resin such as a phenol resin, a urea resin, a melamine resin, an alkyd resin, or mica in addition to the dielectric polymer materials.

Further, for the purpose of improving the pressure sensitive adhesiveness, a viscosity imparting agent such as rosin ester, rosin, terpene, terpene phenol, or a petroleum resin may be added.

In the polymer matrix 24 of the piezoelectric layer 12, the addition amount in a case of adding polymer materials other than the polymer material having a viscoelasticity at room temperature is not particularly limited, but is preferably set to 30% by mass or less in terms of the proportion of the polymer materials in the matrix 24.

In this manner, the characteristics of the polymer material to be added can be exhibited without impairing the viscoelastic relieving mechanism in the polymer matrix 24, and thus preferable results, for example, an increase in the dielectric constant, improvement of the heat resistant, and improvement of the adhesiveness between the piezoelectric particles 26 and the electrode layer can be obtained.

The piezoelectric layer 12 (polymer-based piezoelectric composite material) contains the piezoelectric particles 26 in the polymer matrix 24.

It is preferable that the piezoelectric particles 26 consist of ceramics particles having a perovskite type or wurtzite type crystal structure.

Examples of the ceramic particles constituting the piezoelectric particles 26 include lead zirconate titanate (PZT), lead lanthanum zirconate titanate (PLZT), barium titanate ($BaTiO_3$), zinc oxide (ZnO), and a solid solution (BFBT) of barium titanate and bismuth ferrite ($BiFe_3$).

The particle diameter of the piezoelectric particles 26 may be appropriately selected according to the size and the applications of the piezoelectric film 10. The particle diameter of the piezoelectric particles 26 is preferably in a range of 1 to 10 μm.

By setting the particle diameter of the piezoelectric particles 26 to be in the above-described range, preferable results in terms of achieving both excellent piezoelectric characteristics and flexibility can be obtained.

In FIG. 1, the piezoelectric particles 26 in the piezoelectric layer 12 are uniformly dispersed in the polymer matrix 24 with regularity, but the present invention is not limited thereto.

That is, the piezoelectric particles 26 in the piezoelectric layer 12 may be irregularly dispersed in the polymer matrix 24 as long as the piezoelectric particles 26 are preferably uniformly dispersed therein.

In the piezoelectric film 10, the ratio between the amount of the polymer matrix 24 and the amount of the piezoelectric particles 26 in the piezoelectric layer 12 may be appropriately set according to the size and the thickness of the piezoelectric film 10 in the plane direction, the applications of the piezoelectric film 10, the characteristics required for the piezoelectric film 10, and the like.

The volume fraction of the piezoelectric particles 26 in the piezoelectric layer 12 is preferably in a range of 30% to 80% and particularly preferably 50% by volume or greater. Therefore, the volume fraction thereof is set to be more preferably in a range of 50% to 80%.

By setting the ratio between the amount of the polymer matrix 24 and the amount of the piezoelectric particles 26 to be in the above-described range, preferable results in terms of achieving both of excellent piezoelectric characteristics and flexibility can be obtained.

In the piezoelectric film 10, the thickness of the piezoelectric layer 12 is not limited and may be appropriately set according to the size of the piezoelectric film 10, the applications of the piezoelectric film 10, the characteristics required for the piezoelectric film 10, and the like.

The thickness of the piezoelectric layer 12 is preferably in a range of 8 to 300 μm, more preferably in a range of 8 to 200 μm, still more preferably in a range of 10 to 150 μm, and particularly preferably in a range of 15 to 100 μm.

By setting the thickness of the piezoelectric layer 12 to be in the above-described range, preferable results in terms of achieving both ensuring of the rigidity and moderate elasticity can be obtained.

It is preferable that the piezoelectric layer 12 is subjected to a polarization treatment (poling) in the thickness direction. The polarization treatment will be described in detail later.

The piezoelectric film 10 illustrated in FIG. 1 has a configuration in which the lower thin film electrode 14 is provided on one surface of the piezoelectric layer 12, the lower protective layer 18 is provided on the lower thin film electrode 14 as a preferred embodiment, the upper thin film electrode 16 is provided on the other surface of the piezoelectric layer 12, and the upper protective layer 20 is provided on the upper thin film electrode 16 as a preferred embodiment. In the piezoelectric film 10, the upper thin film electrode 16 and the lower thin film electrode 14 form an electrode pair.

That is, the piezoelectric film 10 according to the embodiment of the present invention has a configuration in which both surfaces of the piezoelectric layer 12 are sandwiched between the electrode pair, that is, the upper thin film electrode 16 and the lower thin film electrode 14 and preferably between the upper protective layer 20 and the lower protective layer 18.

The region sandwiched between the upper thin film electrode 16 and the lower thin film electrode 14 of the piezoelectric layer 12 is driven according to the applied voltage.

Further, the piezoelectric film 10 may further have, for example, a bonding layer for bonding the thin film electrode and the piezoelectric layer 12 to each other and a bonding layer for bonding the thin film electrode and the protective layer to each other, in addition to the above-described layers. A known bonding agent can be used as the bonding layer as long as the objects to be bonded satisfy the following conditions of the destructive force and can be bonded to each other. The bonding agent may be an adhesive or a pressure sensitive adhesive. Further, the same material as the polymer material obtained by removing the piezoelectric particles 26 from the piezoelectric layer 12, that is, the polymer matrix 24 can also be suitably used as the bonding agent. Further, the bonding layer may be provided on both the upper thin film electrode 16 side and the lower thin film electrode 14 side or may be provided on only one of the upper thin film electrode 16 side or the lower thin film electrode 14 side.

Further, the piezoelectric film 10 may further include an electrode lead portion that leads out the electrodes from the upper thin film electrode 16 and the lower thin film electrode 14, and an insulating layer which covers a region where the piezoelectric layer 12 is exposed for preventing a short circuit or the like, in addition to the above-described layers.

The electrode lead portion may be configured such that a portion where the thin film electrode and the protective layer project convexly outside the piezoelectric layer in the plane direction is provided or configured such that a part of the protective layer is removed to form a hole portion, and a conductive material such as silver paste is inserted into the hole portion so that the conductive material is conducted with the thin film electrode.

Each thin film electrode may have only one or two or more electrode lead portions. Particularly in a case of the configuration in which the electrode lead portion is obtained by removing a part of the protective layer and inserting a conductive material into the hole portion, it is preferable that the thin film electrode has three or more electrode lead portions in order to more reliably ensure the conduction.

The upper protective layer 20 and the lower protective layer 18 in the piezoelectric film 10 have a function of covering the upper thin film electrode 16 and the lower thin film electrode 14 and applying moderate rigidity and mechanical strength to the piezoelectric layer 12. That is, in the piezoelectric film 10 according to the embodiment of the present invention, the piezoelectric layer 12 containing the polymer matrix 24 and the piezoelectric particles 26 exhibits extremely excellent flexibility under bending deformation at a slow vibration, but may have insufficient rigidity or mechanical strength depending on the applications. As a compensation for this, the piezoelectric film 10 is provided with the upper protective layer 20 and the lower protective layer 18.

The lower protective layer 18 and the upper protective layer 20 have the same configuration except for the disposition position. Therefore, in the description below, in a case where it is not necessary to distinguish the lower protective layer 18 from the upper protective layer 20, both members are collectively referred to as a protective layer.

According to a more preferred embodiment, the piezoelectric film 10 in the example illustrated in the figure has the lower protective layer 18 and the upper protective layer 20 in a manner of being laminated on both thin film electrodes. However, the present invention is not limited thereto, and a configuration having only one of the lower protective layer 18 or the upper protective layer 20 may be employed.

The protective layer is not limited, and various sheet-like materials can be used as the protective layer, and suitable examples thereof include various resin films. Among these, from the viewpoints of excellent mechanical characteristics and heat resistance, a resin film consisting of polyethylene terephthalate (PET), polypropylene (PP), polystyrene (PS), polycarbonate (PC), polyphenylene sulfide (PPS), polymethylmethacrylate (PMMA), polyetherimide (PEI), polyimide (PI), polyamide (PA), polyethylene naphthalate (PEN), triacetyl cellulose (TAC), and a cyclic olefin-based resin is suitably used.

The thickness of the protective layer is not limited. In addition, the thicknesses of the upper protective layer 20 and the lower protective layer 18 are basically the same as each other, but may be different from each other.

Here, in a case where the rigidity of the protective layer is extremely high, not only is the stretch and contraction of the piezoelectric layer 12 constrained, but also the flexibility is impaired. Therefore, it is advantageous that the thickness of the protective layer decrease except for the case where the mechanical strength or excellent handleability as a sheet-like material is required.

Based on the examination conducted by the present inventors, in a case where the thickness of the upper protective layer 20 and the thickness of the lower protective layer 18 are respectively two times or less the thickness of the piezoelectric layer 12, preferable results in terms of achieving both ensuring of the rigidity and moderate elasticity can be obtained.

For example, in a case where the thickness of the piezoelectric layer 12 is 50 µm and the lower protective layer 18 and the upper protective layer 20 consist of PET, the thickness of the lower protective layer 18 and the thickness of the upper protective layer 20 are respectively preferably 100 µm or less, more preferably 50 µm or less, and still more preferably 25 µm or less.

In the piezoelectric film 10, the upper thin film electrode 16 is formed between the piezoelectric layer 12 and the upper protective layer 20, and the lower thin film electrode 14 is formed between the piezoelectric layer 12 and the lower protective layer 18. In the description below, the upper thin film electrode 16 is also referred to as an upper electrode 16, and the lower thin film electrode 14 is also referred to as a lower electrode 14.

The upper electrode 16 and the lower electrode 14 are provided to apply an electric field to the piezoelectric film 10 (piezoelectric layer 12).

Further, the lower electrode 14 and the upper electrode 16 are basically the same as each other. Therefore, in the description below, in a case where it is not necessary to distinguish the lower electrode 14 from the upper electrode 16, both members are collectively referred to as a thin film electrode.

In the piezoelectric film according to the embodiment of the present invention, the material for forming the thin film electrode is not limited, and various conductors can be used as the material. Specific examples thereof include conductive polymers such as carbon, palladium, iron, tin, aluminum, nickel, platinum, gold, silver, copper, chromium, molybdenum, alloys thereof, indium tin oxide, and polyethylene dioxythiophene-polystyrene sulfonic acid (PEDOT/PPS).

Among these, copper, aluminum, gold, silver, platinum, and indium tin oxide are suitable. Among these, from the viewpoints of the conductivity, the cost, and the flexibility, copper is more preferable.

In addition, the method of forming the thin film electrode is not limited, and various known methods, for example, a film forming method such as a vapor-phase deposition method (a vacuum film forming method) such as vacuum vapor deposition or sputtering, a film forming method using plating, a method of bonding a foil formed of the materials described above, and a coating method can be used.

Among these, particularly from the viewpoint of ensuring the flexibility of the piezoelectric film 10, a thin film made of copper, aluminum, or the like formed by vacuum vapor deposition is suitably used as the thin film electrode. Among these, particularly a thin film made of copper formed by vacuum vapor deposition is suitably used.

The thickness of the upper electrode 16 and the lower electrode 14 is not limited. In addition, the thicknesses of the upper electrode 16 and the lower electrode 14 may be basically the same as or different from each other.

Here, similarly to the protective layer described above, in a case where the rigidity of the thin film electrode is extremely high, not only is the stretch and contraction of the piezoelectric layer 12 constrained, but also the flexibility is impaired. Therefore, it is advantageous that the thicknesses of the thin film electrode decreases in a case where the electrical resistance is not excessively high.

It is suitable that the product of the thicknesses of the thin film electrode of the piezoelectric film 10 according to the embodiment of the present invention and the Young's modulus thereof is less than the product of the thickness of the protective layer and the Young's modulus thereof because the flexibility is not considerably impaired.

For example, in a case of a combination consisting of the protective layer formed of PET (Young's modulus: approximately 6.2 GPa) and the thin film electrode formed of copper (Young's modulus: approximately 130 GPa), the thickness of the thin film electrode is preferably 1.2 µm or less, more preferably 0.3 µm or less, and still more preferably 0.1 µm or less in a case of assuming that the thickness of the protective layer is 25 µm.

As described above, the piezoelectric film 10 has a configuration in which the piezoelectric layer 12 containing the piezoelectric particles 26 in the polymer matrix 24 containing the polymer material is sandwiched between the upper electrode 16 and the lower electrode 14 and the laminate is further sandwiched between the upper protective layer 20 and the lower protective layer 18.

It is preferable that, in such a piezoelectric film 10, the maximal value at which the loss tangent (tan δ) at a frequency of 1 Hz according to dynamic viscoelasticity measurement is 0.1 or greater is present at room temperature.

In this manner, even in a case where the piezoelectric film 10 is subjected to bending deformation at a slow vibration of less than or equal to a few Hz from the outside, since the strain energy can be effectively diffused to the outside as heat, occurrence of cracks on the interface between the polymer matrix and the piezoelectric particles can be prevented.

In the piezoelectric film 10, it is preferable that the storage elastic modulus (E') at a frequency of 1 Hz according to the dynamic viscoelasticity measurement is 10 to 30 GPa at 0° C. and 1 to 10 GPa at 50° C.

In this manner, the piezoelectric film 10 may have large frequency dispersion in the storage elastic modulus (E') at room temperature. That is, the piezoelectric film 10 can exhibit a behavior of being rigid with respect to a vibration of 20 Hz to 20 kHz and being flexible with respect to a vibration of less than or equal to a few Hz.

In the piezoelectric film 10, it is preferable that the product of the thickness and the storage elastic modulus (E') at a frequency of 1 Hz according to the dynamic viscoelasticity measurement is in a range of $1.0 \times 10^6$ to $2.0 \times 10^6$ N/m at 0° C. and in a range of $1.0 \times 10^5$ to $1.0 \times 10^6$ N/m at 50° C.

In this manner, the piezoelectric film 10 may have moderate rigidity and mechanical strength within a range not impairing the flexibility and the acoustic characteristics.

Further, in the piezoelectric film 10, it is preferable that the loss tangent (Tan δ) at a frequency of 1 kHz at 25° C. is 0.05 or greater in a master curve obtained from the dynamic viscoelasticity measurement.

In this manner, the frequency of a speaker using the piezoelectric film 10 is smooth as the frequency characteristic thereof, and thus a change in acoustic quality in a case where the lowest resonance frequency f0 is changed according to a change in the curvature of the speaker (piezoelectric film 10) can be decreased.

As described above, in the piezoelectric film according to the embodiment of the present invention, the variation coefficient of the destructive force of a laminate having the polymer-based piezoelectric composite material and the electrode layers in the plane direction is 0.25 or less. Further, in the piezoelectric film of the present invention, the average value of the destructive force of the laminate including the polymer-based piezoelectric composite material and the electrode layers is preferably 3N or greater.

Therefore, in the example illustrated in the figure, the variation coefficient of the destructive force of the piezoelectric film 10 which is the laminate including the lower electrode 14 provided on one surface (one main surface) of the piezoelectric layer 12, the upper electrode 16 provided on the other surface (the other main surface) of the piezoelectric layer 12, the lower protective layer 18 provided on the surface of the lower electrode 14, and the upper protective layer 20 provided on the surface of the upper electrode 16, in the plane direction, is 0.25 or less, and the average value of the destructive force is 3 N or greater.

Further, the main surface is the maximum surface of the sheet-like material. Therefore, the main surface of the laminate is typically the surface in the thickness direction, that is, the surface of each layer constituting the laminate in the laminated direction.

In the piezoelectric film according to the embodiment of the present invention, the variation coefficient of the destructive force of the laminate having the polymer-based piezoelectric composite material and the electrode layers in the plane direction is 0.25 or less. In the description below, the variation coefficient of the destructive force in the plane direction is also simply referred to as the "variation coefficient of the destructive force".

Therefore, in the present invention, for example, in a case where the piezoelectric film consists of only the piezoelectric layer and the thin film electrodes provided on both surfaces of the piezoelectric layer, the variation coefficient of the destructive force of the piezoelectric film which is the laminate consisting of the piezoelectric layer and the electrode layers is 0.25 or less, and the average value of the destructive force is 3 N or greater.

Further, for example, in a case where the piezoelectric film includes a bonding layer that bonds the thin film electrodes and the piezoelectric layer and/or a bonding layer that bonds the thin film electrodes and the protective layers in addition to the piezoelectric layer, the thin film electrodes, and the protective layers, the variation coefficient of the destructive force of the piezoelectric film which has the piezoelectric layer and the thin film electrodes and is the laminate consisting of the piezoelectric layer, the thin film electrodes, the protective layers, and the bonding layer is 0.25 or less, and the average value of the destructive force is 3 N or greater.

Further, for example, in a case where the piezoelectric film includes other layers in addition to the piezoelectric layer, the thin film electrodes, and the protective layers, the variation coefficient of the destructive force of the piezoelectric film which has the piezoelectric layer and the thin film electrodes and is the laminate consisting of the piezoelectric layer, the thin film electrodes, the protective layers, and other layers is 0.25 or less, and the average value of the destructive force is 3 N or greater. Examples of other layers included in the piezoelectric film include a gas barrier layer, a decorative layer, a separator, and an insulating layer.

In the present invention, the fracture of the laminate (piezoelectric film) indicates not the fracture (breakage) in the plane direction but the fracture in the thickness direction.

Specifically, in the present invention, the fracture of the laminate indicates both interlayer peeling of the laminate, that is, peeling at the interface of each layer and fracture in the layer constituting the laminate in the thickness direction, that is, cohesive fracture (cohesive peeling) in the layer the thickness direction. In the present invention, in a case where at least one of interlayer peeling or cohesive fracture occurs, the laminate is considered to be fractured.

That is, in the present invention, the destructive force of the laminate indicates the force required to fracture the laminate in the thickness direction. More specifically, the destructive force of the laminate indicates the force required to fracture the laminate in the thickness direction in a case where each layer is pulled from the main surface side of the laminate in the peeling direction in a state where the other main surface of the laminate is fixed. In the piezoelectric film 10 according to the embodiment of the present invention, the variation coefficient of the destructive force in the plane direction of 0.25 or less.

The method of measuring the destructive force of the piezoelectric film as the laminate and the method of calculating the average value and the variation coefficient of the destructive force in the present invention will be described with reference to the conceptual view of FIG. 2.

A sample S for measurement which has a size of 20×200 mm is cut out from the piezoelectric film 10 whose destructive force is to be measured.

The entire one main surface of the sample S in the longitudinal direction is fixed to a sample stand 72 with double-sided tape 70.

Next, pressure sensitive adhesive tape 74 is bonded to the entire surface of the sample S fixed to the sample stand 72 in the longitudinal direction. The pressure sensitive adhesive tape 74 is longer than twice the length of the sample S in the longitudinal direction. As illustrated in FIG. 2, the pressure sensitive adhesive tape 74 is used to bond one end portion side of the sample S in the longitudinal direction to the entire surface of the sample S in the longitudinal direction and is folded back on one end portion side of the sample S in the longitudinal direction. For example, commercially available cellophane tape may be used as the pressure sensitive adhesive tape 74.

In this case, the double-sided tape 70 and the pressure sensitive adhesive tape 74 are not necessarily bonded to the entire surface of the sample S in the width direction. That is, the width of the double-sided tape 70 and the pressure sensitive adhesive tape 74 (the length thereof in the lateral direction) may be the same as or shorter than the width of the sample S. From the viewpoints of bonding the entire surface of the double-sided tape 70 and the entire surface of the pressure sensitive adhesive tape 74 to the sample S and sufficiently exhibiting a predetermined pressure sensitive adhesive force, it is preferable that the width of the double-sided tape 70 and the width of the pressure sensitive adhesive tape 74 are respectively set to be slightly shorter than the width of the sample S. Further, from the viewpoint that the double-sided tape 70 and the pressure sensitive adhesive tape 74 exhibit a predetermined pressure sensitive adhesive force sufficiently, it is preferable that the double-sided tape 70 and the pressure sensitive adhesive tape 74 do not protrude from the sample S in the width direction.

However, in any case, the bonding force between the sample S and the double-sided tape 70 and the adhesive tape 74 needs to be sufficiently strong with respect to the fracture strength of the sample S, that is, the piezoelectric film 10. Further, the strength of the pressure sensitive adhesive tape 74 needs to be sufficiently strong with respect to the fracture strength of the sample S, that is, the piezoelectric film 10.

The towing metal fitting 76 is fixed in the vicinity of the end portion side where the folded-back pressure sensitive adhesive tape 74 is folded back, that is, in the vicinity of the end portion side where the pressure sensitive adhesive tape 74 is not bonded to the sample S.

Further, a measuring end portion 78 of a stress measuring device is engaged with the metal fitting 76. As the stress measuring device, a commercially available force gauge (such as a push-pull gauge or a push-pull scale) may be used.

The stress measuring device is allowed to move in the direction (the direction indicated by the arrow Z) along the bonding surface of the sample S on the sample stand 72 from the above-described state. In this manner, the sample S is pulled from the side where the pressure sensitive adhesive tape 74 has been folded such that the sample S is peeled off along the sample stand 72 in a pulling direction of 180°. The pulling speed of the sample S is set to 100 mm/min. The moving of the stress measuring device, that is, the pulling with the pulling device may be performed by using, for example, a commercially available device (force gauge stand) corresponding to the stress measuring device.

The stress [N] related to the stress measuring device in a case where the sample S is pulled in a pulling direction of 180° is measured, the measured value is defined as destructive force [N] of the sample S, that is, the piezoelectric film.

The measurement of the fracture strength of the sample S is performed on 300 points of the sample S at intervals of 10 points/sec while the sample S is pulled.

Figure 3:
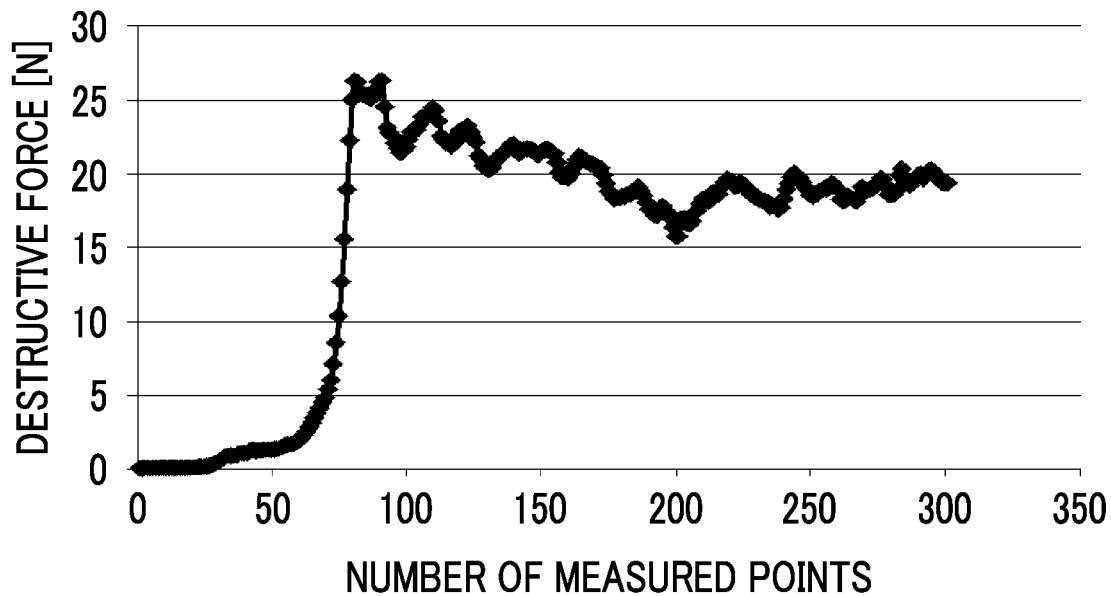
FIG. 3 is a graph showing an example of measurement results of the destructive force of the piezoelectric film.

FIG. 3 illustrates an example of the measurement result of the destructive force of the piezoelectric film. Further, the measurement result of the destructive force is the measurement result in Example 1 of the present invention described later.

As illustrated in FIG. 3, the destructive force of the sample S, that is, the piezoelectric film is low at the beginning of the measurement, rises sharply at a certain point, and then enters a state corresponding to the destructive force of the piezoelectric film 10. Therefore, the average value of the destructive force of the piezoelectric film, the standard deviation of the destructive force of the piezoelectric film, and the variation coefficient of the destructive force of the piezoelectric film are calculated using the measurement results of 200 points excluding the initial 100 points from among the 300 points on which the measurement has been performed.

First, the average value (AVE) of the destructive force of the piezoelectric film is calculated. Next, the standard deviation ($\sigma$) of the destructive force of the piezoelectric film is calculated. Thereafter, the variation coefficient of the destructive force of the piezoelectric film in the plane direction is calculated by dividing the standard deviation of the destructive force of the piezoelectric film by the average value of the destructive force of the piezoelectric film. That is, the equation of "variation coefficient=$\sigma$/AVE" is satisfied.

In the piezoelectric film 10 according to the embodiment of the present invention, the variation coefficient of the destructive force measured in the above-described manner is 0.25 or less, and the average value of the destructive force of the piezoelectric film 10 is preferably 3N or greater.

As described above, for example, the piezoelectric speaker (electroacoustic conversion film) formed of the piezoelectric film is required to have characteristics such as a characteristic of obtaining a sufficient sound pressure (volume) with respect to an input operating voltage, a characteristic of obtaining a sufficient sound pressure in a wide frequency band, and a characteristic of suppressing generation of a so-called chattering sound particularly in a low frequency region (low pitched sound region).

The present inventors conducted intensive examination on a piezoelectric film from which a piezoelectric speaker satisfying the above-described characteristics in the piezoelectric film is obtained.

As a result, in the piezoelectric film 10 that has thin film electrodes on both surfaces of the piezoelectric layer 12 (polymer-based piezoelectric composite material) containing the piezoelectric particles 26 in the polymer matrix 24 and is formed by being sandwiched between protective layers, the present inventors found that adhesiveness between layers and in layers is important in order to satisfy the above-described characteristics.

In the piezoelectric film which is the laminate is obtained by laminating a plurality of layers having different viscoelasticities in the thickness direction. The piezoelectric film converts the electric signal into air vibration (sound) by vibrating these layers integrally in response to the electric signal.

In this case, in a case where each layer is uniformly adhered between layers and each layer is not uniformly adhered in the layer, a change of the piezoelectric layer due to the electric signal is not efficiently transmitted to the inside of the piezoelectric layer and other layers. That is, in a case where the piezoelectric films are not uniformly and integrally bonded inside, including between layers and in layers, the change due to the electrical signal is not be efficiently transmitted in the piezoelectric film, and thus the electric-acoustic conversion efficiency is degraded.

As a result, in a case where the adhesiveness of the piezoelectric film is not uniform, the transmission loss of vibration energy in the layers and between the layers is large, and problems of a decrease in sound pressure and deterioration in the frequency characteristics of output occur. Particularly in the low frequency region where a large amount of energy is required, the acoustic characteristics are remarkably deteriorated, and thus a problem of generation of a so-called chattering sound occurs.

On the contrary, in the piezoelectric film 10 according to the embodiment of the present invention, the variation coefficient of the destructive force of the laminate is 0.25 or less. That is, the piezoelectric film 10 according to the embodiment of the present invention adheres between the layers and in the layers of the laminate with uniform adhesive force over the entire surface, and the inside of the film is integrally bonded.

As a result, in a case where the piezoelectric film 10 according to the embodiment of the present invention is used as the piezoelectric speaker (electroacoustic conversion film), excellent characteristics such as a characteristic of sufficiently obtaining the sound pressure (volume) with respect to the input operation voltage, a characteristic of obtaining a sufficient sound pressure in a wide frequency band, and a characteristic of sufficiently suppressing a chattering sound particularly in a lower frequency region are exhibited.

Particularly in a case where the average value of the destructive force is set to 3 N or greater, the piezoelectric film 10 according to the embodiment of the present invention exhibits the above-described excellent characteristics more significantly and is capable of realizing a high-performance piezoelectric speaker capable of obtaining a high sound pressure and suppressing a chattering sound in a low frequency region.

In the piezoelectric film 10 according to the embodiment of the present invention, in a case where the variation coefficient of the destructive force is greater than 0.25, inconveniences such as insufficient sound pressure with respect to the input operating voltage and generation of a large amount of chattering sound in a low frequency region occur.

The variation coefficient of the destructive force is preferably 0.22 or less and more preferably 0.18 or less.

The lower limit of the variation coefficient is not limited, but it is preferable that the variation coefficient is basically low. In consideration of ease of production and the like, the lower limit thereof is 0.02 or greater.

In the piezoelectric film 10 according to the embodiment of the present invention, the average value of the destructive force is preferably 3N or greater as described above. From the viewpoint of more suitably obtaining the above-described excellent characteristics, the average value of the destructive force is more preferably 3.9 N or greater and still more preferably 5 N or greater.

The upper limit of the average value of the destructive force is not limited, but it is preferable that the average value thereof is basically high. In consideration of the usable material and the like, the upper limit thereof is 40 N or less.

Figure 4:
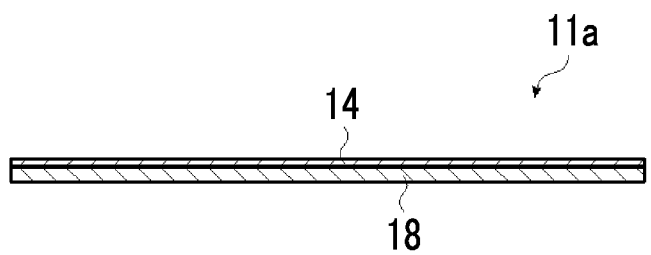
FIG. 4 is a conceptual view for describing a method of preparing the piezoelectric film illustrated in FIG. 1.
Figure 5:
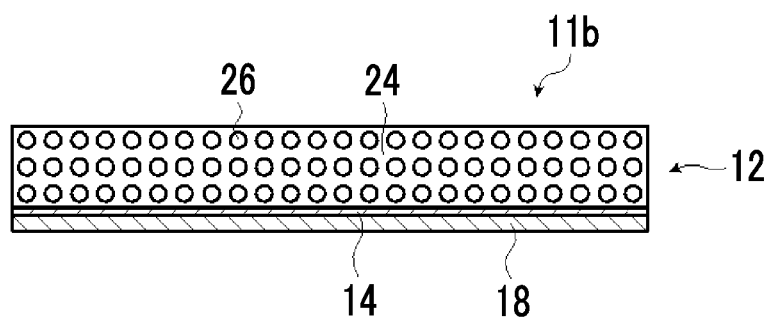
FIG. 5 is a conceptual view for describing a method of preparing the piezoelectric film illustrated in FIG. 1.
Figure 6:
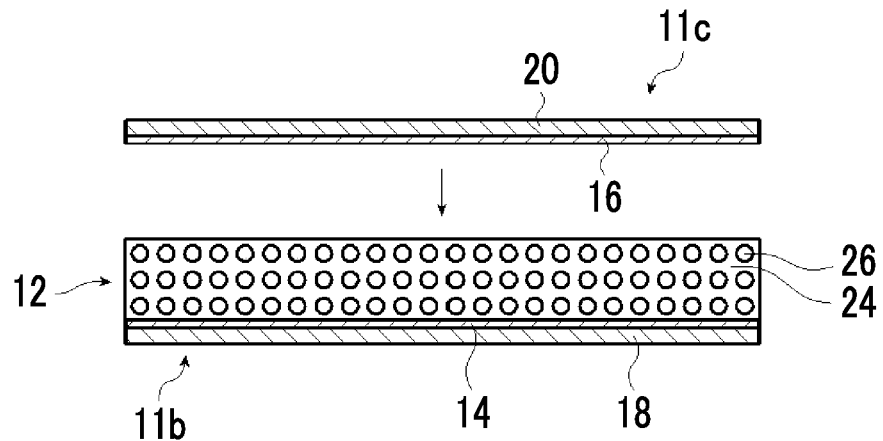
FIG. 6 is a conceptual view for describing a method of preparing the piezoelectric film illustrated in FIG. 1.

FIGS. 4 to 6 conceptually illustrate an example of the method of producing the piezoelectric film 10.

First, as illustrated in FIG. 4, a lower electrode laminate 11a which is a sheet-like material in which the lower electrode 14 is formed on the lower protective layer 18 is prepared.

Further, as illustrated in FIG. 6, an upper electrode laminate 11c which is a sheet-like material obtained by laminating the upper thin film electrode 16 and the upper protective layer 20 is prepared.

The lower electrode laminate 11a may be prepared by forming a copper thin film or the like as the lower thin film electrode 14 on the surface of the lower protective layer 18 using vacuum vapor deposition, sputtering, plating, or the like. Similarly, the upper electrode laminate 11c may be prepared by forming a copper thin film or the like as the upper thin film electrode 16 on the surface of the upper protective layer 20 using vacuum vapor deposition, sputtering, plating, or the like.

Alternatively, a commercially available sheet-like material in which a copper thin film or the like is formed on a protective layer may be used as the lower electrode laminate 11a and/or the upper electrode laminate 11c.

The lower electrode laminate 11a and the upper electrode laminate 11c may be exactly the same as or different from each other.

In a case where the protective layer is extremely thin and thus the handleability is degraded, a protective layer with a separator (temporary support) may be used as necessary. Further, a PET having a thickness of 25 to 100 µm or the like can be used as the separator. The separator may be removed after thermal compression bonding of the thin film electrode and the protective layer.

Next, as illustrated in FIG. 5, a laminate 11b obtained by laminating the lower electrode laminate 11a and the piezoelectric layer 12 is prepared by coating the lower electrode 14 of the lower electrode laminate 11a with a coating material (coating composition) that is the piezoelectric layer 12 and curing the material to form the piezoelectric layer 12.

First, the coating material is prepared by dissolving the polymer material in an organic solvent, adding the piezoelectric particles 26 such as PZT particles thereto, and stirring the solution.

The organic solvent is not limited, and various organic solvents such as dimethylformamide (DMF), methyl ethyl ketone, and cyclohexanone can be used.

In a case where the lower electrode laminate 11a is prepared and the coating material is prepared, the coating material is cast (applied) onto the lower electrode laminate 11a, and the organic solvent is evaporated and dried. In this manner, as illustrated in FIG. 5, a laminate 11b in which the lower electrode 14 is provided on the lower protective layer 18 and the piezoelectric layer 12 is laminated on the lower electrode 14 is prepared.

A casting method of the coating material is not limited, and all known methods (coating devices) such as a bar coater, a slide coater, and a doctor knife can be used.

Alternatively, in a case where the polymer material is a material that can be heated and melted, the laminate 11b as illustrated in FIG. 5 may be prepared by heating and melting the polymer material to prepare a melt obtained by adding the piezoelectric particles 26 to the melted material, extruding the melt on the lower electrode laminate 11a illustrated in FIG. 4 in a sheet shape by carrying out extrusion molding or the like, and cooling the laminate.

As described above, in the piezoelectric film 10, a polymer piezoelectric material such as PVDF may be added to the polymer matrix 24 in addition to the polymer material having a viscoelasticity at room temperature.

In a case where the polymer piezoelectric material is added to the polymer matrix 24, the polymer piezoelectric material to be added to the coating material may be dissolved. Alternatively, the polymer piezoelectric material added may be added to the heated and melted polymer material having a viscoelasticity at room temperature so that the polymer piezoelectric material is heated and melted.

Next, the piezoelectric layer 12 of the laminate 11b in which the lower electrode 14 is provided on the lower protective layer 18 and the piezoelectric layer 12 is formed on the lower electrode 14 is subjected to the polarization treatment (poling).

The method of performing a polarization treatment on the piezoelectric layer 12 is not limited, and a known method can be used. As an example, electric field poling in which a DC electric field is directly applied to the piezoelectric layer 12 is exemplified. Further, in a case of performing electric field poling, the electric filed poling treatment may be performed using the upper electrode 16 and the lower electrode 14 by forming the upper electrode 16 before the polarization treatment.

Further, in a case where the piezoelectric film 10 according to the embodiment of the present invention is produced, the polarization treatment is performed in the thickness direction of the piezoelectric layer 12 (polymer-based piezoelectric composite material) instead of the plane direction.

In addition, before the polarization treatment, a calender treatment of smoothing the surface of the piezoelectric layer 12 using a heating roller or the like may be performed. By performing the calender treatment, a thermal compression bonding step described below can be smoothly performed.

Next, as illustrated in FIG. 6, the upper electrode laminate 11c that has been prepared in advance is laminated on the piezoelectric layer 12 of the laminate 11b that has been subjected to the polarization treatment such that the upper electrode 16 is directed toward the piezoelectric layer 12.

Further, the piezoelectric film 10 according to the embodiment of the present invention as illustrate in FIG. 1 is prepared by performing thermal compression bonding on the laminate using a heating press device, heating rollers, or the like such that the laminate is sandwiched between the lower protective layer 18 and the upper protective layer 20 and bonding the laminate 11b and the upper electrode laminate 11c to each other.

Further, the piezoelectric film 10 according to the embodiment of the present invention may be prepared by bonding or preferably compression-bonding the laminate 11b and the upper electrode laminate 11c to each other using an adhesive.

The piezoelectric film 10 according to the embodiment of the present invention to be prepared in the above-described manner is polarized in the thickness direction instead of the plane direction, and thus excellent piezoelectric characteristics are obtained even in a case where the stretching treatment is not performed after the polarization treatment. Therefore, the piezoelectric film 10 according to the embodiment of the present invention has no in-plane anisotropy as a piezoelectric characteristic, and stretches and contracts isotropically in all directions in the in-plane direction in a case where a driving voltage is applied.

In such a method of producing the piezoelectric film 10, the piezoelectric film 10 according to the embodiment of the present invention in which the variation coefficient of the destructive force is 0.25 or less and the average value of the destructive force is preferably 3 N or greater can be suitably produced by performing two treatments from among a defoaming treatment of the coating material for forming the piezoelectric layer 12, low-speed drying for gradually drying the applied coating material, and an air bubble removing treatment in a case of thermal compression bonding of the laminate or compression bonding of the laminate with an adhesive.

It is preferable that the piezoelectric film 10 according to the embodiment of the present invention in which the variation coefficient of the destructive force is 0.25 or less and the average value of the destructive force is preferably 3 N or greater can be more suitably produced by performing all the deforming treatment, the low-speed drying, and the air bubble removing treatment.

The fluctuation (unevenness) of the destructive force, that is, the adhesive force of the piezoelectric film 10 as the laminate is caused by air bubbles present inside the piezoelectric layer 12. Therefore, the fluctuation of the destructive force of the piezoelectric film 10 can be reduced and the average value of the destructive force of the piezoelectric film 10 can be increased by performing the defoaming treatment in a case where a coating material for forming the piezoelectric layer 12 is prepared and the lower electrode 14 (coating surface) is coated with the coating material.

The defoaming treatment of the coating material is not limited, and various known defoaming treatment methods from liquids can be used. Examples of such defoaming treatments include vacuum defoaming, stirring defoaming, and static defoaming. The conditions for these defoaming treatments may be appropriately set such that sufficient defoaming can be performed according to the defoaming treatment to be performed and the state of the coating material.

Further, in a case where bonding of the piezoelectric layer 12 and the thin film electrode and/or bonding of the thin film electrode and the protective layer is performed using a bonding layer, it is also effective that such a defoaming treatment is performed on a bonding agent before the bonding.

The fluctuation of the destructive force, that is, the adhesive force of the piezoelectric film 10 as the laminate are also affected by the surface properties of the piezoelectric layer 12. The surface properties of the piezoelectric layer 12 are affected by the drying of the coating material that is carried out after the thin film electrode is coated with the coating material to be formed into the piezoelectric layer 12. That is, in a case where rapid drying is performed according to a drying method of promoting evaporation of a solvent by heating the solvent with a heater or the like or a drying method of promoting drying by blowing air to make a difference in solvent concentration (vapor pressure) on the surface of the coating material, the solvent that evaporates from the coating material in a state of being blown up on the surface, the surface of the coating material before being dried is disturbed by the air blow, and the surface of the piezoelectric layer 12 is roughened.

On the contrary, in a case where low-speed drying of slowly drying the coating material after the coating material formed into the piezoelectric layer 12 is applied is performed, the surface properties of the piezoelectric layer 12 are improved, the fluctuation of the destructive force of the piezoelectric film 10 can be reduced and the average value of the destructive force of the piezoelectric film 10 can be increased.

Examples of the low-speed drying method include a method of applying the coating material and naturally drying the coating material in a static zone where the temperature is in a range of 20° C. to 30° C. Further, examples of other low-speed drying methods include a method of applying dry air from the surface of the coating material on a support side (the lower protective layer side in the example illustrated in the figure) initially in an atmosphere of room temperature and gradually increasing the ambient temperature to dry the coating material. In the latter method, the wind force of the dry air and the ambient temperature may be appropriately set such that low-speed drying is sufficiently performed according to the state of the coating material and the like.

The fluctuation of the destructive force, that is, the adhesive force of the piezoelectric film 10 as the laminate is also caused by the air bubbles present between the piezoelectric layer 12 and the thin film electrode and between the thin film electrode and the protective layer. Therefore, in a case where thermal compression bonding of each layer and/or compression bonding of each layer using an adhesive is performed to produce the piezoelectric film 10, the fluctuation of the destructive force of the piezoelectric film 10 can be reduced and the average value of the destructive force of the piezoelectric film 10 can be increased by performing the air bubble removing treatment. For example, in the method of producing the piezoelectric film illustrated in FIGS. 4 to 6 described above, the air bubble removing treatment is performed in a case of performing the thermal compression bonding of the laminate 11b and the upper electrode laminate 11c or compression bonding of the layers using a bonding agent.

A method of using a W helical roll as a compression bonding roll is exemplified as a method of performing the air bubble removing treatment during the compression bonding. Further, a method of using a crown roll (radial crown roll) as a compression bonding roll is exemplified as another method of performing the defoaming treatment during the compression bonding. Here, in a case where the compression bonding is performed while the laminate is sandwiched and transported using nip rollers, as the W helical roll and the crown roll, only rollers on the side of layers to be laminated and compression-bonded or a W helical roll and the like together with the both rollers may be used.

The piezoelectric film 10 according to the embodiment of the present invention may be produced using the lower electrode laminate 11a and the upper electrode laminate 11c in a cut sheet shape and preferably using roll-to-roll (Roll to Roll). In the following description, roll-to-roll is also referred to as "RtoR".

As is well known, RtoR is a production method of pulling out a long raw material from a roll around which the raw material is wound, performing various treatments such as film formation and a surface treatment while transporting the raw material in the longitudinal direction, and winding the treated raw material into a roll shape again.

In a case where the piezoelectric film 10 is produced using the above-described production method by RtoR, a first roll obtained by winding the long lower electrode laminate 11a and a second roll obtained by winding the long upper electrode laminate 11c are used.

The first roll and the second roll may be exactly the same.

The laminate 11b obtained by laminating the lower electrode laminate 11a and the piezoelectric layer 12 is prepared by pulling out the lower electrode laminate 11a from the first roll, coating the lower electrode 14 of the lower electrode laminate 11a with the coating material containing the polymer material and the piezoelectric particles 26 while the laminate is transported in the longitudinal direction, and drying the coating material by performing heating or the like to form the piezoelectric layer 12 on the lower electrode 14.

Next, the piezoelectric layer 12 is subjected to the polarization treatment. Here, in a case where the piezoelectric film 10 is produced by RtoR, the polarization treatment is performed on the piezoelectric layer 12 by a rod-like electrode disposed in a state of extending in a direction orthogonal to the transport direction of the laminate 11b while the laminate 11b is transported. Before the polarization treatment, the calender treatment may be performed as described above. Further, the polarization treatment is performed on the piezoelectric layer 12 in the thickness direction.

Next, the upper electrode laminate 11c is pulled out from the second roll, and the upper electrode laminate 11c is laminated on the laminate 11b such that the upper thin film electrode 16 is directed toward the piezoelectric layer 12 according to a known method of using a bonding roller or the like while the upper electrode laminate 11c and the laminate 11b are transported.

Thereafter, the laminate 11b and the upper electrode laminate 11c are sandwiched and transported by a pair of heating rollers to be subjected to thermal compression bonding to complete the piezoelectric film 10 according to the embodiment of the present invention, and the piezoelectric film 10 is wound in a roll shape.

By performing two treatments and preferably three treatments from among the defoaming treatment, the low-speed drying for slowly drying the applied coating material, and the air bubble removing treatment during compression bonding even in a case of production of the piezoelectric film 10 by RtoR, the piezoelectric film 10 according to the embodiment of the present invention in which the variation coefficient of the destructive force is 0.25 or less and the average value of the destructive force is preferably 3 N or greater can be produced.

In the above-described example, the piezoelectric film 10 according to the embodiment of the present invention is prepared by transporting the sheet-like material (laminate) only once in the longitudinal direction by RtoR, but the present invention is not limited thereto.

For example, the laminate is formed and subjected to the polarization treatment, and the laminate 11b is wound once into a roll shape to obtain a laminate roll. Next, the laminate 11b is pulled out from the laminate roll, the upper electrode laminate 11c is laminated and subjected to thermal compression bonding as described above while the laminate is transported in the longitudinal direction to prepare the piezoelectric film 10, and the piezoelectric film 10 may be wound into a roll shape.

Figure 7:
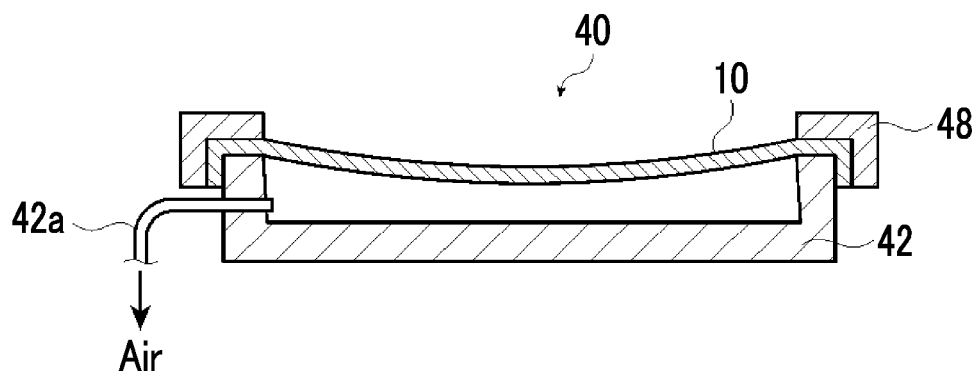
FIG. 7 is a view conceptually illustrating an example of a piezoelectric speaker using the piezoelectric film illustrated in FIG. 1.

FIG. 7 is a conceptual view illustrating an example of a flat plate type piezoelectric speaker including the piezoelectric film 10 according to the embodiment of the present invention.

The piezoelectric speaker 40 is a flat plate type piezoelectric speaker that uses the piezoelectric film 10 according to the embodiment of the present invention as a vibration plate that converts an electrical signal into vibration energy. Further, the piezoelectric speaker 40 can also be used as a microphone, a sensor, or the like.

The piezoelectric speaker 40 is configured to include the piezoelectric film 10, a case 42, and a pressing lid 48.

The case 42 is a cylindrical housing formed of plastic or the like and having one surface that is open. A pipe 42a to be inserted into the case 42 is provided on a side surface of the case 42.

Further, the pressing lid 48 is a frame having a substantially L-shaped cross section, and is inserted into the open surface of the case 42 and fitted thereto.

In the piezoelectric speaker 40, the open surface of the case 42 is airtightly blocked by covering the case 42 with the piezoelectric film 10 such that the open surface is closed by the piezoelectric film 10 and fitting the pressing lid 48 to the case 42 from above the piezoelectric film 10. Further, an O-ring or the like for maintaining airtightness may be provided between the upper surface of the side wall of the case 42 and the piezoelectric film 10, as necessary.

In this state, the air inside the case 42 is released from the pipe 42a to maintain the piezoelectric film 10 in a concave state as illustrated in FIG. 7. On the contrary, the piezoelectric film 10 may be maintained in a convex state by introducing air into the case 42 from the pipe 42a.

In the piezoelectric speaker 40, in a case where the piezoelectric film 10 is stretched in the in-plane direction due to the application of a driving voltage to the lower electrode 14 and the upper electrode 16, the piezoelectric film 10 in a concave state due to decompression moves downward in order to absorb the stretched part.

On the contrary, in a case where the piezoelectric film 10 is contracted in the in-plane direction due to the application of a driving voltage to the lower electrode 14 and the upper electrode 16, the piezoelectric film 10 in a concave state moves upward in order to absorb the contracted part.

The piezoelectric speaker 40 generates a sound by the vibration of the piezoelectric film 10.

In the piezoelectric film 10 according to the embodiment of the present invention, the conversion from the stretching and contracting movement to vibration can also be achieved by holding the piezoelectric film 10 in a curved state.

Therefore, the piezoelectric film 10 according to the embodiment of the present invention can function as a piezoelectric speaker having flexibility by being simply maintained in a curved state instead of the piezoelectric speaker 40 having rigidity in a flat plate shape, as illustrated in FIG. 7.

The piezoelectric speaker formed of the piezoelectric film 10 according to the embodiment of the present invention can be stored in a bag or the like by, for example, being rolled or folded using the excellent flexibility. Therefore, with the piezoelectric film 10 according to the embodiment of the present invention, a piezoelectric speaker that can be easily carried even in a case where the piezoelectric speaker has a certain size can be realized.

Further, as described above, the piezoelectric film 10 according to the embodiment of the present invention has excellent elasticity and excellent flexibility, and has no in-plane anisotropy as a piezoelectric characteristic. Therefore, in the piezoelectric film 10 according to the embodiment of the present invention, a change in sound quality regardless of the direction in which the film is bent is small, and a change in sound quality with respect to the change in curvature is also small. Accordingly, the piezoelectric speaker formed of the piezoelectric film 10 according to the embodiment of the present invention has a high degree of freedom of the installation place and can be attached to various products as described above. For example, a so-called wearable speaker can be realized by attaching the piezoelectric film 10 according to the embodiment of the present invention to clothing such as a suit and portable items such as a bag in a curved state.

Further, as described above, the piezoelectric film according to the embodiment of the present invention can be used for a speaker of a display device by bonding the piezoelectric film to a display device having flexibility such as an organic EL display device having flexibility or a liquid crystal display device having flexibility.

As described above, the piezoelectric film 10 according to the embodiment of the present invention stretches and contracts in the plane direction in a case where a voltage is applied, and vibrates suitably in the thickness direction due to the stretch and contraction in the plane direction. Therefore, an excellent acoustic characteristic of reducing generation of a chattering sound in a low frequency region and outputting a sound with a high sound voltage is exhibited in a case where the piezoelectric film 10 according to the embodiment of the present invention is used for a piezoelectric speaker or the like.

The piezoelectric film 10 according to the embodiment of the present invention, which exhibits excellent acoustic characteristics, that is, high stretch and contraction performance due to piezoelectricity is satisfactorily operated as a piezoelectric vibrating element that vibrates a vibration body such as a vibration plate by laminating a plurality of the piezoelectric films.

Further, in a case of lamination of the piezoelectric films 10, each piezoelectric film may not have the upper protective layer 20 and/or the lower protective layer 18 unless there is a possibility of a short circuit. Alternatively, the piezoelectric film that does not have the upper protective layer 20 and/or the lower protective layer 18 may be laminated through an insulating layer.

As an example, a speaker in which a laminate of the piezoelectric films 10 is bonded to the vibration plate and the vibration plate is vibrated by the laminate of the piezoelectric films 10 to output a sound may be used. That is, in this case, the laminate of the piezoelectric film 10 acts as a so-called exciter that outputs a sound by vibrating the vibration plate.

By applying a driving voltage to the laminated piezoelectric films 10, each piezoelectric film 10 stretches and contracts in the plane direction, and the entire laminate of the piezoelectric film 10 stretches and contracts in the plane direction due to the stretch and contraction of each piezoelectric film 10. The vibration plate to which the laminate has been attached is bent due to the stretch and contraction of the laminate of the piezoelectric film 10 in the plane direction, and thus the vibration plate vibrates in the thickness direction. The vibration plate generates a sound using the vibration in the thickness direction. The vibration plate vibrates according to the magnitude of the driving voltage applied to the piezoelectric film 10 and generates a sound according to the driving voltage applied to the piezoelectric film 10.

Therefore, the piezoelectric film 10 itself does not output sound in this case.

Therefore, even in a case where the rigidity of each piezoelectric film 10 is low and the stretching and contracting force thereof is small, the rigidity is increased by laminating the piezoelectric films 10, and the stretching and contracting force as the entire laminate is increased. As a result, in the laminate of the piezoelectric films 10, even in a case where the vibration plate has a certain degree of rigidity, the vibration plate is sufficiently bent with a large force and the vibration plate can be sufficiently vibrated in the thickness direction, whereby the vibration plate can generate a sound.

In the laminate of the piezoelectric film 10, the number of laminated piezoelectric films 10 is not limited, and the number of sheets set such that a sufficient amount of vibration is obtained may be appropriately set according to, for example, the rigidity of the vibration plate to be vibrated.

Further, one piezoelectric film 10 according to embodiment of the present invention can also be used as a similar exciter (piezoelectric vibrating element) in a case where the piezoelectric film has a sufficient stretching and contracting force.

The vibration plate vibrated by the laminate of the piezoelectric film 10 according to the embodiment of the present invention is not limited, and various sheet-like materials (such as plate-like materials and films) can be used.

Examples thereof include a resin film consisting of polyethylene terephthalate (PET) and the like, foamed plastic consisting of foamed polystyrene and the like, a paper material such as a corrugated cardboard material, a glass plate, and wood. Further, a device such as a display device may be used as the vibration plate in a case where the device can be sufficiently bent.

It is preferable that the laminate of the piezoelectric film 10 according to the embodiment of the present invention is obtained by bonding adjacent piezoelectric films with a bonding layer (bonding agent). Further, it is preferable that the laminate of the piezoelectric film 10 and the vibration plate are also bonded to each other with a bonding layer.

The bonding layer is not limited, and various layers that can bond materials to be bonded can be used. Therefore, the bonding layer may consist of a pressure sensitive adhesive or an adhesive. It is preferable that an adhesive layer consisting of an adhesive is used from the viewpoint that a solid and hard bonding layer is obtained after the bonding.

The same applies to the laminate formed by folding back the long piezoelectric film 10 described later.

In the laminate of the piezoelectric films 10, the polarization direction of each piezoelectric film 10 to be laminated is not limited. As described above, the polarization direction of the piezoelectric film 10 according to the embodiment of the present invention is the polarization direction in the thickness direction.

Therefore, in the laminate of the piezoelectric films 10, the polarization directions may be the same for all the piezoelectric films 10, and piezoelectric films having different polarization directions may be present.

Here, in the laminate of the piezoelectric films 10, it is preferable that the piezoelectric films 10 are laminated such that the polarization directions of the adjacent piezoelectric films 10 are opposite to each other.

In the piezoelectric film 10, the polarity of the voltage to be applied to the piezoelectric layer 12 depends on the polarization direction. Therefore, even in a case where the polarization direction is directed from the upper electrode 16 toward the lower electrode 14 or from the lower electrode 14 toward the upper electrode 16, the polarity of the upper electrode 16 and the polarity of the lower electrode 14 in all the piezoelectric films 10 to be laminated are set to be the same polarity.

Therefore, by reversing the polarization directions of the adjacent piezoelectric films 10, even in a case where the thin film electrodes of the adjacent piezoelectric films 10 come into contact with each other, the thin film electrodes in contact with each other have the same polarity, and thus there is no risk of a short circuit.

The laminate of the piezoelectric film 10 may be configured such that a long piezoelectric film 10 is folded back, for example, once or more times, or preferably a plurality of times to laminate a plurality of layers of the piezoelectric films 10.

The structure in which the long piezoelectric film 10 is folded back and laminated has the following advantages.

That is, in the laminate in which a plurality of cut sheet-like piezoelectric films 10 are laminated, the upper electrode 16 and the lower electrode 14 need to be connected to a driving power source for each piezoelectric film. On the contrary, in the configuration in which the long piezoelectric film 10 is folded back and laminated, only one sheet of the long piezoelectric film 10 can form the laminate. Further, in the configuration in which the long piezoelectric film 10 is folded back and laminated, only one power source is required for applying the driving voltage, and the electrode may be pulled out from the piezoelectric film 10 at one place.

Further, in the configuration in which the long piezoelectric film 10 is folded back and laminated, the polarization directions of the adjacent piezoelectric films 10 are inevitably opposite to each other.

Hereinbefore, the piezoelectric film according to the embodiment of the present invention have been described in detail, but the present invention is not limited to the above-described examples, and various improvements or modifications may be made within a range not departing from the scope of the present invention.

EXAMPLES

Hereinafter, the present invention will be described in more detail with reference to specific examples of the present invention. Further, the present invention is not limited to the examples, and the materials, the used amounts, the proportions, the treatment contents, the treatment procedures, and the like shown in the following examples can be appropriately changed within a range not departing from the scope of the present invention.

[Method of Producing Piezoelectric Film]

Piezoelectric films having the layer configuration illustrated in FIG. 1 were produced by the methods illustrated in FIGS. 4 to 6.

Further, the method of producing a piezoelectric film described below is a basic method of producing a piezoelectric film in examples and comparative examples of the present invention, and specific operations and conditions for <liquid preparation step>, <coating and drying step>, and <bonding step> will be described in each of the examples and the comparative examples.

<Liquid Preparation Step>

First, cyanoethylated PVA (CR-V, manufactured by Shin-Etsu Chemical Co., Ltd.) was dissolved in methyl ethyl ketone (MEK) at the following compositional ratio. Thereafter, PZT particles were added to the solution at the following compositional ratio and dispersed using a propeller mixer (rotation speed of 2000 rpm), thereby preparing a coating material for forming a piezoelectric layer.

PZT Particles: 300 parts by mass
Cyanoethylated PVA: 15 parts by mass
MEK: 85 parts by mass In addition, PZT particles obtained by sintering commercially available PZT raw material powder at 1000° C. to 1200° C. and crushing and classifying the sintered powder to have an average particle diameter of 5 μm were used as the PZT particles.

<Coating and Drying Step>

A sheet-like material (lower electrode laminate) obtained by performing vacuum vapor deposition on a copper thin film having a thickness of 0.1 μm was prepared on a PET film having a thickness of 4 μm. That is, in the present example, the lower electrode is a copper-deposited thin film having a thickness of 0.1 m, and the lower protective layer is a PET film having a thickness of 4 μm.

The coating material for forming the piezoelectric layer prepared in advance was applied onto the copper thin film of the sheet-like material using a slide coater. Further, the coating material was applied such that the film thickness of the coating film after being dried reached 40 μm. A piezoelectric layer was formed by drying the coating material.

In this manner, a laminate in which the thin film electrode made of copper was provided on the protective layer made of PET and the piezoelectric layer having a thickness of 40 μm was provided thereon was prepared.

<Polarization Treatment Step>

The piezoelectric layer of the laminate was subjected to a polarization treatment.

<Bonding Step>

A sheet-like material (upper electrode laminate) obtained by performing vacuum vapor deposition on a copper thin film having a thickness of 0.1 μm was prepared on a PET film having a thickness of 4 μm in the same manner as described above. That is, in the present example, the upper electrode is also a copper-deposited thin film having a thickness of 0.1 m, and the upper protective layer is a PET film having a thickness of 4 μm.

The laminate and the prepared sheet-like material were laminated by allowing the copper thin film and the piezoelectric layer that had been subjected to the polarization treatment to face each other.

Next, the laminate of the laminate and the sheet-like material was subjected to thermal compression bonding at 120° C. using a laminator device to bond the piezoelectric layer and the upper thin film electrode, thereby preparing the piezoelectric film having the layer configuration illustrated in FIG. 1. Further, the laminator device is a device that performs compression bonding using a compression bonding roll. The pressing force was 1.5 MPa.

The piezoelectric film was prepared by performing the following operation in the <liquid preparation step>, <coating and drying step>, and <bonding step> according to the production method.

Example 1

In the liquid preparation step, a coating material for forming the piezoelectric layer was prepared, and vacuum defoaming at 30 kPa was performed for 5 minutes.

In the coating and drying step, the applied coating material was naturally dried in a standing zone at 20° C. to 30° C.

In the bonding step, thermal compression bonding was performed using a W helical roll (WH roll) as a compression bonding roll.

Example 2

In the liquid preparation step, a coating material for forming the piezoelectric layer was prepared, and vacuum defoaming at 30 kPa was performed for 5 minutes.

In the coating and drying step, the applied coating material was naturally dried in a standing zone at 20° C. to 30° C.

In the bonding step, thermal compression bonding was performed using a radial crown roll (RC roll) as a compression bonding roll.

Example 3

In the liquid preparation step, a coating material for forming the piezoelectric layer was prepared, and vacuum defoaming at 30 kPa was performed for 5 minutes.

In the coating and drying step, the applied coating material was dried (drying in steps) by initially blowing dry air having a wind speed of 5 m/sec from the sheet-like material side (lower electrode side) in an atmosphere of 20° C. to 30° C. for 5 minutes, blowing dry air having a wind speed of 5 m/sec from the sheet-like material side in an atmosphere of 40° C. for 5 minutes, and blowing dry air having a wind speed of 5 m/sec from the sheet-like material side in an atmosphere of 50° C. for 5 minutes.

In the bonding step, thermal compression bonding was performed using a W helical roll (WH roll) as a compression bonding roll.

Example 4

In the liquid preparation step, a coating material for forming a piezoelectric layer was prepared, and stirring and defoaming were performed by applying a revolution centrifugal force of 300 G for 7 minutes.

In the coating and drying step, the applied coating material was naturally dried in a standing zone at 20° C. to 30° C.

In the bonding step, thermal compression bonding was performed using a W helical roll (WH roll) as a compression bonding roll.

Example 5

In the liquid preparation step, a coating material for forming a piezoelectric layer was prepared, static defoaming was performed by allowing the coating material to stand in a closed container in a stationary state for 2 hours.

In the coating and drying step, the applied coating material was naturally dried in a standing zone at 20° C. to 30° C.

In the bonding step, thermal compression bonding was performed using a W helical roll (WH roll) as a compression bonding roll.

Example 6

In the liquid preparation step, a coating material for forming a piezoelectric layer was prepared, but no treatment was performed (without defoaming).

In the coating and drying step, the applied coating material was naturally dried in a standing zone at 20° C. to 30° C.

In the bonding step, thermal compression bonding was performed using a W helical roll (WH roll) as a compression bonding roll.

Example 7

In the liquid preparation step, a coating material for forming a piezoelectric layer was prepared, but no treatment was performed (without defoaming).

In the coating and drying step, the applied coating material was naturally dried in a standing zone at 20° C. to 30° C.

In the bonding step, thermal compression bonding was performed using a radial crown roll (RC roll) as a compression bonding roll.

Comparative Example 1

In the liquid preparation step, a coating material for forming a piezoelectric layer was prepared, but no treatment was performed (without defoaming).

In the coating and drying step, the applied coating material was naturally dried in a standing zone at 20° C. to 30° C.

In the bonding step, a normal flat roll was used as a compression bonding roll, and thermal compression bonding was performed without performing the air bubble removing treatment (without air bubble removal).

Comparative Example 2

In the liquid preparation step, a coating material for forming the piezoelectric layer was prepared, and vacuum defoaming at 30 kPa was performed for 5 minutes.

In the coating and drying step, the applied coating material was dried by heating the coating material to 100° C. (normal drying).

In the bonding step, a normal flat roll was used as a compression bonding roll, and thermal compression bonding was performed without performing the air bubble removing treatment (without air bubble removal).

Comparative Example 3

In the liquid preparation step, a coating material for forming a piezoelectric layer was prepared, but no treatment was performed (without defoaming).

In the coating and drying step, the applied coating material was dried by heating the coating material to 100° C. (normal drying).

In the bonding step, a normal flat roll was used as a compression bonding roll, and thermal compression bonding was performed without performing the air bubble removing treatment (without air bubble removal).

[Measurement of Average Value and Variation Coefficient of Destructive Force]

Figure 2:
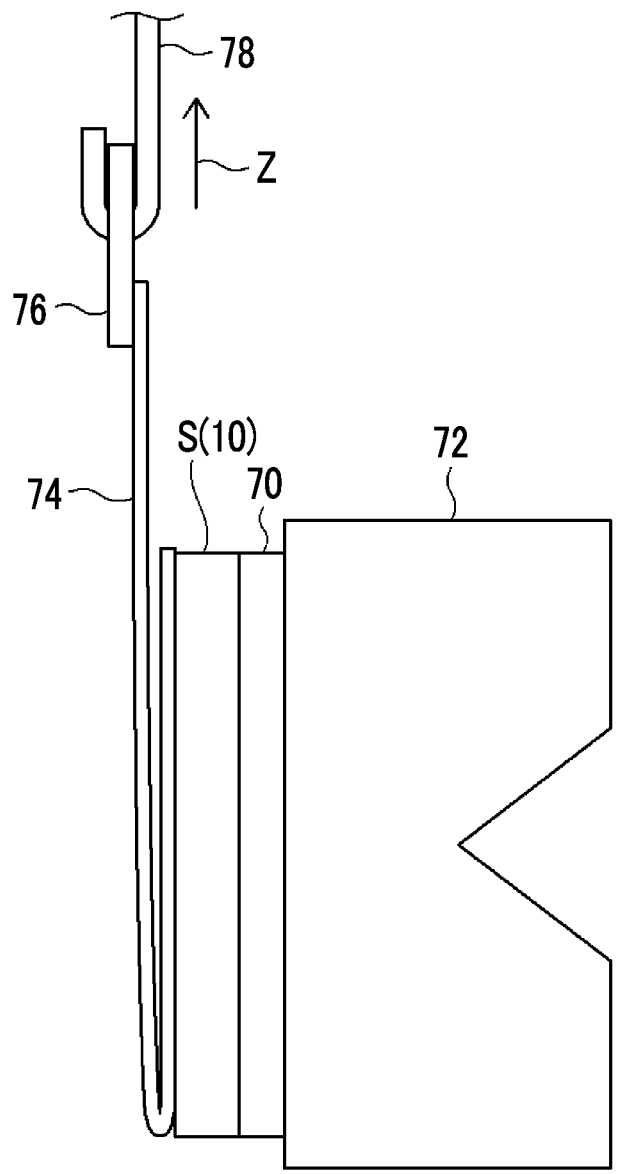
FIG. 2 is a conceptual view for describing a method of measuring a destructive force of the piezoelectric film.

The destructive force of the prepared piezoelectric film was measured by the method illustrated in FIG. 2.

A V block was used as a sample stand. A 3M Scotch (R) 655-3-18 mm (manufactured by 3M) was used as double-sided tape for bonding a sample (piezoelectric film) to the sample stand.

Further, as pressure sensitive adhesive tape for being bonded to the sample and pulling the sample in a direction of 180° in a state of being folded back, plant-based No. 405 (18 mm) (manufactured by Nichiban Co., Ltd.) was used.

Further, the bonding force between the sample and the double-sided tape and the adhesive tape and the strength of the pressure sensitive adhesive tape are sufficiently strong with respect to the assumed destructive force of the piezoelectric film. Therefore, in the measurement, peeling of the double-sided tape and the pressure sensitive adhesive tape from the sample and breakage of the pressure sensitive adhesive tape do not occur during the measurement of the destructive force of the piezoelectric film.

As a pressure measuring device, FGP-5 (for 50.0 N) (manufactured by Nidec Corporation) was used.

Further, FGS-50E-L (low speed specification) (manufactured by Nidec Corporation) was used as a moving unit (pulling device) of the stress measuring device.

In this manner, as described above, the stress applied to the stress measuring device, that is, the destructive force of the piezoelectric film [N] was measured with respect to 300 points of the sample at intervals of 10 points/sec by allowing the stress measuring device to move at a speed of 100 mm/min and pulling the pressure sensitive adhesive tape in a direction of 180°. As described above, FIG. 3 shows the measurement results of the destructive force of the piezoelectric film of Example 1.

As described above, the average value of the destructive force, the standard deviation of the destructive force, and the variation coefficient of the destructive force were calculated using 200 points excluding the initial 100 points in the start of the measurement from the destructive force of the measured piezoelectric film.

Figure 8:
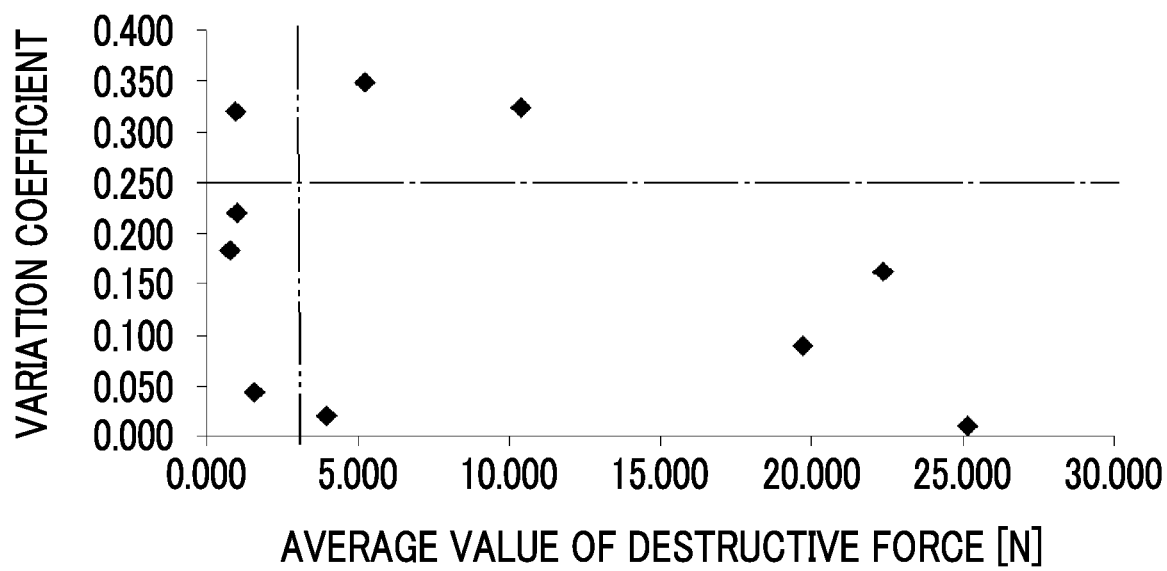
FIG. 8 is a graph showing the relationship between the variation coefficient and the average value of the destructive force measured in examples.

The results are listed in the table below. Further, FIG. 8 shows the relationship between the variation coefficient and the average value of the destructive force.

[Evaluation]

<Measurement of Sound Pressure>

(Preparation of Piezoelectric Speaker)

A circular test piece having a diameter of 70 mm was cut out from the prepared conversion film, thereby preparing a piezoelectric speaker as illustrated in FIG. 7.

The case was a cylindrical container with one open surface, and a plastic cylindrical container having an opening portion with a diameter of 60 mm and a depth of 10 mm was used.

The piezoelectric film was disposed such that the opening portion of the case was covered, the peripheral portion was fixed with a pressing lid, the air inside the case was exhausted from a pipe, the pressure inside the case was maintained at 0.09 MPa, and the piezoelectric film was curved in a concave shape, thereby preparing a piezoelectric speaker.

(Measurement of Sound Pressure)

Figure 9:
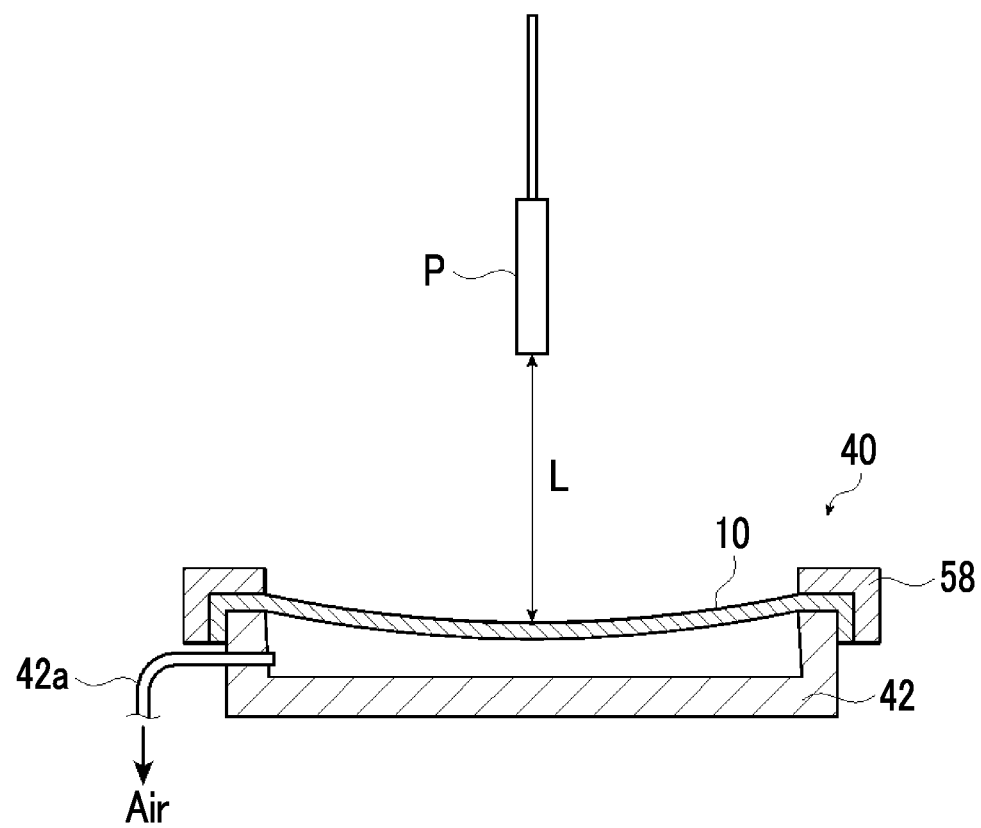
FIG. 9 is a conceptual view for describing a method of measuring the sound pressure.

As conceptually illustrated in FIG. 9, the sound pressure [dB/W·m] was measured by disposing a microphone P at a position separated from the center of the piezoelectric film of the piezoelectric speaker by 0.5 m (distance L=0.5 m) and inputting a 1 W sine wave with a frequency of 3 kHz to a space between the upper electrode and the lower electrode of the piezoelectric film.

<Evaluation of Chattering Sound>

The prepared piezoelectric speaker was used to sweep a 1 W sine wave from a frequency of 50 Hz to a frequency of 100 Hz for 10 seconds, and the generation of a chattering sound in a low frequency region was evaluated by sensory evaluation.

A case where any chattering sound was not heard was evaluated as A, a case where a chattering sound was generated at a frequency of 50 Hz during the sweeping and disappeared in the middle of the sweeping was evaluated as B, and a case where a chattering sound was continuously generated up to a frequency of 100 Hz during the sweeping was evaluated as C.

The results are listed in the table below.

EXPLANATION OF REFERENCES

10: piezoelectric film
11a: lower electrode laminate
11b: laminate
11c: upper electrode laminate
12: piezoelectric layer
14: lower (thin film) electrode
16: upper (thin film) electrode
18: lower protective layer
20: upper protective layer
24: polymer matrix
26: piezoelectric particle
40: piezoelectric speaker
42: case
48: pressing lid

TABLE 1

| | Treatment in each step | | | Measurement result of destructive force | | | Evaluation | |
|---|---|---|---|---|---|---|---|---|
| | Liquid preparation | Coating and drying | Bonding | Average value [N] | Standard deviation | Variation coefficient | Sound pressure [dB/W · m] | Chattering sound |
| Example 1 | Vacuum defoaming | Natural drying | WH roll | 19.715 | 1.774 | 0.090 | 89.1 | A |
| Example 2 | Vacuum defoaming | Natural drying | RC roll | 25.132 | 0.270 | 0.011 | 89.1 | A |
| Example 3 | Vacuum defoaming | Stepwise drying | WH roll | 22.344 | 3.620 | 0.162 | 85.1 | A |
| Example 4 | Stirring defoaming | Natural drying | WH roll | 3.932 | 0.082 | 0.021 | 88.9 | A |
| Example 5 | Static defoaming | Natural drying | WH roll | 1.588 | 0.070 | 0.044 | 82.2 | A |
| Example 6 | Without defoaming | Natural drying | WH roll | 1.000 | 0.220 | 0.220 | 81.8 | A |
| Example 7 | Without defoaming | Natural drying | RC roll | 0.764 | 0.140 | 0.183 | 80.5 | A |
| Comparative Example 1 | Without defoaming | Natural drying | Without air bubble removing | 10.369 | 3.359 | 0.324 | 79.1 | B |
| Comparative Example 2 | Vacuum defoaming | Normal drying | Without air bubble removing | 5.210 | 1.818 | 0.349 | 78.5 | B |
| Comparative Example 3 | Without defoaming | Normal drying | Without air bubble removing | 0.970 | 0.310 | 0.320 | 63.2 | C |

As listed in the table, in the piezoelectric film according to the embodiment of the present invention, in which the variation coefficient of the destructive force of the laminate is 0.25 or less, which is on the lower side of the dashed line in the graph shown in FIG. 8, the sound pressure in a case of forming a piezoelectric speaker is high and generation of a chattering sound in a low frequency region is suppressed. Particularly in the piezoelectric speaker formed of the piezoelectric film in which the variation coefficient of the destructive force is 0.25 or less and the average value of the destructive force is 3 N or greater, which is on the lower side of the dashed line and on the right side of the chain double-dashed line in the graph shown in FIG. 8, a higher sound pressure is obtained.

On the contrary, in the piezoelectric film of each comparative example in which the variation coefficient of the destructive force of the laminate is greater than 0.25, which is on the lower side of the dashed line in the graph shown in FIG. 8, the sound pressure is low as compared with the piezoelectric film according to the embodiment of the present invention and a chattering sound is generated.

As shown in the results described above, the effects of the present invention are apparent.

What is claimed is:

1. A piezoelectric film comprising:
a polymer-based piezoelectric composite material which contains piezoelectric particles in a matrix containing a polymer material; and
electrode layers which are laminated on both surfaces of the polymer-based piezoelectric composite material,
wherein a variation coefficient of a destructive force of a laminate having the polymer-based piezoelectric composite material and the electrode layers in a plane direction is 0.25 or less.

2. The piezoelectric film according to claim 1,
wherein an average value of the destructive force of the laminate is 3 N or greater.

3. The piezoelectric film according to claim 1, further comprising:
a protective layer laminated on a surface of at least one electrode layer.

4. The piezoelectric film according to claim 3,
wherein the protective layer is laminated on surfaces of the electrode layers.

5. The piezoelectric film according to claim 1,
wherein the polymer material contains a cyanoethyl group.

6. The piezoelectric film according to claim 5,
wherein the polymer material is cyanoethylated polyvinyl alcohol.

7. The piezoelectric film according to claim 1,
wherein the piezoelectric particles consist of ceramic particles having a perovskite-type or wurtzite-type crystal structure.

8. The piezoelectric film according to claim 2, further comprising:
a protective layer laminated on a surface of at least one electrode layer.

9. The piezoelectric film according to claim 8,
wherein the protective layer is laminated on surfaces of the electrode layers.

10. The piezoelectric film according to claim 2,
wherein the polymer material contains a cyanoethyl group.

11. The piezoelectric film according to claim 10,
wherein the polymer material is cyanoethylated polyvinyl alcohol.

12. The piezoelectric film according to claim 2,
wherein the piezoelectric particles consist of ceramic particles having a perovskite-type or wurtzite-type crystal structure.

13. The piezoelectric film according to claim 3,
wherein the polymer material contains a cyanoethyl group.

14. The piezoelectric film according to claim 13,
wherein the polymer material is cyanoethylated polyvinyl alcohol.

15. The piezoelectric film according to claim 3,
wherein the piezoelectric particles consist of ceramic particles having a perovskite-type or wurtzite-type crystal structure.

16. The piezoelectric film according to claim 4,
wherein the polymer material contains a cyanoethyl group.

17. The piezoelectric film according to claim 16,
wherein the polymer material is cyanoethylated polyvinyl alcohol.

18. The piezoelectric film according to claim 4,
wherein the piezoelectric particles consist of ceramic particles having a perovskite-type or wurtzite-type crystal structure.

19. The piezoelectric film according to claim 5,
wherein the piezoelectric particles consist of ceramic particles having a perovskite-type or wurtzite-type crystal structure.

20. The piezoelectric film according to claim 6,
wherein the piezoelectric particles consist of ceramic particles having a perovskite-type or wurtzite-type crystal structure.

* * * * *